United States Patent [19]

Vesce et al.

[11] Patent Number: 4,593,213

[45] Date of Patent: Jun. 3, 1986

[54] CURRENT-LIMITED MOSFET SWITCH

[75] Inventors: Richard V. Vesce, East Hampton; John R. Torres, Somers, both of Conn.

[73] Assignee: United Technologies Corporation, Hartford, Conn.

[21] Appl. No.: 614,172

[22] Filed: May 25, 1984

[51] Int. Cl.⁴ .............................................. H03K 17/16
[52] U.S. Cl. ................................ 307/564; 307/200 B; 307/270; 307/297; 307/318; 307/571; 307/584; 363/21; 363/56
[58] Field of Search .................... 307/131, 200 B, 246, 307/570, 571–572, 575, 577, 581, 584, 270, 296 R, 297, 318, 564, 568; 323/312; 330/277, 297; 361/78, 87, 93, 118; 363/21, 56, 91, 131

[56] References Cited

U.S. PATENT DOCUMENTS

| | | | |
|---|---|---|---|
| 3,656,025 | 4/1972 | Roveti | 307/568 X |
| 3,970,869 | 7/1976 | Coats | 307/251 |
| 4,025,803 | 5/1977 | Norberg | 307/318 X |
| 4,078,200 | 3/1978 | Ritchie et al. | 361/87 X |
| 4,125,789 | 11/1978 | Van Schoiack | 307/296 R |
| 4,300,091 | 11/1981 | Schade, Jr. | 307/297 X |
| 4,384,287 | 5/1983 | Sakuma | 307/270 X |
| 4,393,431 | 7/1983 | Gilker | 361/93 X |

OTHER PUBLICATIONS

Kabell et al, "Zener Diode Circuits for Stable Transistor Biasing", Fairchild Technical Articles and Papers, TP-8, 5-1961.

Strauss, *Wave Generation and Shaping*, © 1970 by McGraw Hill, 2nd Edition "MOSFET-gate protection", pp. 215–216.

Semiconductor Data Book, © 1984 by Unitrode, pp. 15-131,132, Note: 5.a. Low Cost Gate Drive Circuit.

*Primary Examiner*—Stanley D. Miller
*Assistant Examiner*—D. R. Hudspeth
*Attorney, Agent, or Firm*—Francis J. Maguire, Jr.

[57] ABSTRACT

A current-limited MOSFET switch is achieved using a zener diode connected from the gate to source of the MOSFET.

4 Claims, 5 Drawing Figures

CURRENT-LIMITED MOSFET SWITCH

TECHNICAL FIELD

This invention relates to clamping the drain current of a metal-oxide-semiconductor field-effect transistor (MOSFET) with a zener diode.

BACKGROUND ART

Microprocessor power supplies are often designed to provide normal operation for short periods during primary power interruptions. The source of power during the interruption is normally a bank of storage capacitors. Over the years designers have steadily improved the holdup period so that the next generation of microprocessor power supplies, especially those used in military applications, will be required to provide normal operation for up to 50 milliseconds. The conventional method of meeting this requirement is to increase the size of the capacitor bank. For some applications, particularly power supplies for airborne computer systems, the "brute force" method (simply increasing the capacitance) is size, weight, and cost prohibitive.

Another approach is to provide holdup power only for the random access memory (RAM), i.e., the volatile memory. This approach is viable because only the information stored in RAM is permanently lost upon loss of power. Information and instructions stored in read only memory (ROM), on the other hand, is nonvolatile and is not permanently lost upon loss of power. Since RAM consumes signficantly less power than the total system, power supplies designed according to this approach can provide holdup power for longer periods. However, an undesirable side-effect of such designs is the nontransparent operation of the computer during the power interruption and the system power "turn-on" and "turn-off" sequencing requirements.

Therefore, a power holdup circuit that provides transparency to primary power interruptions with a minimum of capacitance and maximum efficiency is needed.

DISCLOSURE OF INVENTION

The object of the present invention is to transfer high voltage energy stored in a low capacitance bank to a low voltage bus, with minimum electrical disturbance, using a current-limited MOSFET switch.

According to the present invention a zener diode is connected between the gate and source of a MOSFET having its drain resistance connected between the high voltage source of stored energy and the low voltage bus, for clamping the drain current to a value that minimizes the electrical disturbance resulting from the sudden connection of the high voltage source to the low voltage bus.

In further accord with the present invention, a resistor is connected in parallel with the zener diode in order to provide additional control of the drain current, particularly when the zener diode is operating near its voltage "knee" and also outside of its avalanche region.

The present invention accommodates the need for a simple and highly efficient means of clamping the drain current of a MOSFET. The invention may be practiced in a wide variety of applications including the current-limited MOSFET switch shown in the best mode embodiment described below.

The foregoing and other objects, features and advantages of the present invention will become more apparent in the light of the following detailed description of the best mode embodiment thereof, as illustrated in the accompanying drawing.

BEST MODE FOR CARRYING OUT THE INVENTION

Figure 1:
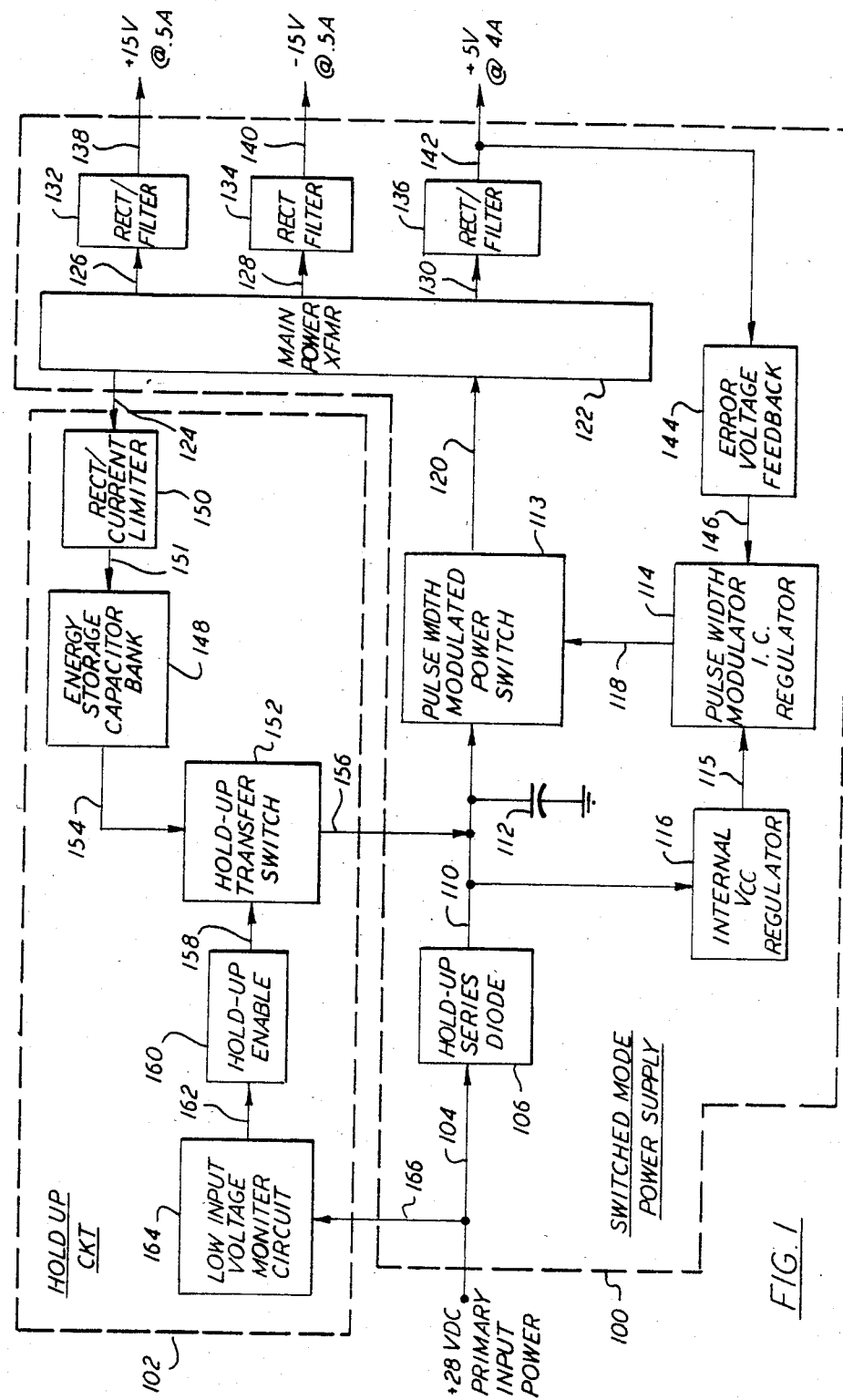
FIG. 1 is a block diagram illustration of a switched mode power supply and a holdup circuit according to the present invention.

FIG. 1 is a block diagram illustration of a switched mode power supply 100 and an associated holdup circuit 102. The switched mode power supply 100 receives 28 volt direct current (28 VDC) primary input power, on a line 104. The 28 VDC on the line 104 is provided to the anode of a diode 106 and an input voltage monitor circuit 164. Primary input current flows through the diode 106 onto a 28 VDC power supply bus on a line 110 which is filtered by a capacitor 112. The capacitor 112 may also be used for storing energy in the event of a power interruption. It is this capacitor that is "beefed-up" in the capacitance in the prior art by the "brute-force" method of increasing the energy storage capability of a power supply. The primary input power on the line 104 is provided to a pulse width modulated power switch 113 which is controlled by a pulse width modulator I.C. regulator 114. The pulse width modulator I.C. regulator 114 receives its operating voltage $V_{CC}$ on a line 115 from an internal $V_{CC}$ regulator 116. The $V_{CC}$ regulator 116 obtains its operating voltage from the 28 VDC bus on the line 110. The pulse width modulator I.C. regulator 114 provides a control signal on a line 118 to the pulse width modulated power switch 112 which controls the flow of power from the 28 VDC bus on the line 110 to an output power line 120.

A main power transformer 122 receives primary input voltage on the line 120 and transforms that voltage to various levels on the lines 124, 126, 128, 130. Rectifier/filters 132, 134, 136 rectify and filter the secondary voltages and provide output voltages, respectively, on the lines 138, 140, 142. The output voltage on the line 142 is sensed by an error voltage feedback circuit 144 which provides an error signal on a line 146 to the pulse width modulator I.C. regulator 114. The pulse width modulator I.C. regulator 114 uses the error signal on the line 146 to vary the width of the pulses generated by the pulse width modulated power switch 113 on the line 120.

The holdup circuit 102, according to the present invention includes a high voltage energy storage capacitor bank 148, a rectifier/current limiter 150 for rectifying the voltage on the line 124 and limiting the current supplied on a line 151 to the capacitor bank 148. The voltage of the charge stored in the capacitor bank 148 is considerably higher than the voltage existing on the 28 VDC bus on the line 110. This is accomplished by using a secondary winding in the main power transformer 122 to step-up the voltage on the line 120 to as much as five or six times higher than its original value and by using high voltage rated capacitors in the capacitor bank 148.

Also included in the holdup circuit 102 is a holdup transfer switch 152 for transferring the high voltage stored energy from the capacitor bank 148 to the low voltage bus on the line 110 with minimum electrical disturbance and maximum efficiency. The holdup transfer switch 152 permits current to flow from the capacitor bank 148 on a line 154, through the switch 152, and onto the low voltage bus 110 on a line 156. The holdup transfer switch 152 responds to an enable signal on a line 158 from a holdup enable circuit 160 by permitting current to flow on the lines 154, 156. The holdup enable circuit provides the enable signal on the line 158 in response to a low input voltage signal on a line 162 from a low input voltage monitor circuit 164. The low input voltage monitor circuit 164 monitors the primary input power bus on the line 104 for a decline in voltage below a selected value. Of course, it should be understood that although the primary input power on the line 104 has been shown as a +28 VDC bus, it could be at any DC level.

During normal operation the holdup transfer switch 152 is disabled and the energy storage capacitor bank 148 is allowed to be charged to the high level DC voltage through the rectifier/current limiter 150 which sets the charge time and limits the load current on the transformer winding. The capacitor bank is sized for energy storage capability sufficient to supply total system power for the duration of the designed holdup time.

Whenever the prime input power drops below the selected minimum threshold level, the low input voltage monitor circuit 164 senses low-line voltage on a line 166 and enables the holdup enable circuit 160 which in turn switches the holdup transfer switch 152 to a conducting state so that electrical current flows from a capacitor bank 148 on the line 154 through the transfer switch 152 and onto a line 156 to the low voltage DC bus on the line 110.

The transfer switch is uniquely designed using a P-channel MOSFET device and a zener diode from gate to source to control the ratio of the energy transfer from the storage capacitor bank 148 to the input capacitor 112 of the pulse width modulated power switch 113. The initial surge of current that occurs when, connecting the high voltage on the line 154 to the low voltage on the line 110 is limited by the clamping action of the zener diode connected across the gate-to-source of the MOSFET.

As the voltage is discharged from the capacitor bank, the series holdup diode 106 becomes back biased and prevents holdup power from feeding back onto the primary input line 104. The capacitor storage bank will provide total operating input power (P) until time (t), when the voltage across the capacitor bank (having capacitance C) has decayed from the maximum storage voltage ($V_H$) to the minimum operating voltage of the switched mode power supply $V_L$. This relationship of circuit parameters is defined according to the classical equation $E = \frac{1}{2}CV^2$, rearranged as follows:

$$t = \frac{C(V_H^2 - V_L^2)}{2P}.$$

Since holdup time (t), total system power (P) and minimum operating voltage ($V_L$) are all fixed by the power supply's design specifications, the value of C is minimized by designing $V_H$ for the highest practical value limited only by the voltage rating of the circuit components.

At the end of the primary power interrupt, the primary input voltage increases to the low-line threshold level at which the input voltage monitor circuit 164 turns off the holdup enable 160 and the holdup transfer switch 152, enabling the primary input power to bias the series diode 106 and provide power to the modulator. With the holdup transfer switch 152 disabled, the capacitor bank 148 is allowed to recharge within a very short time in readiness for the next primary power interrupt.

Figure 2:
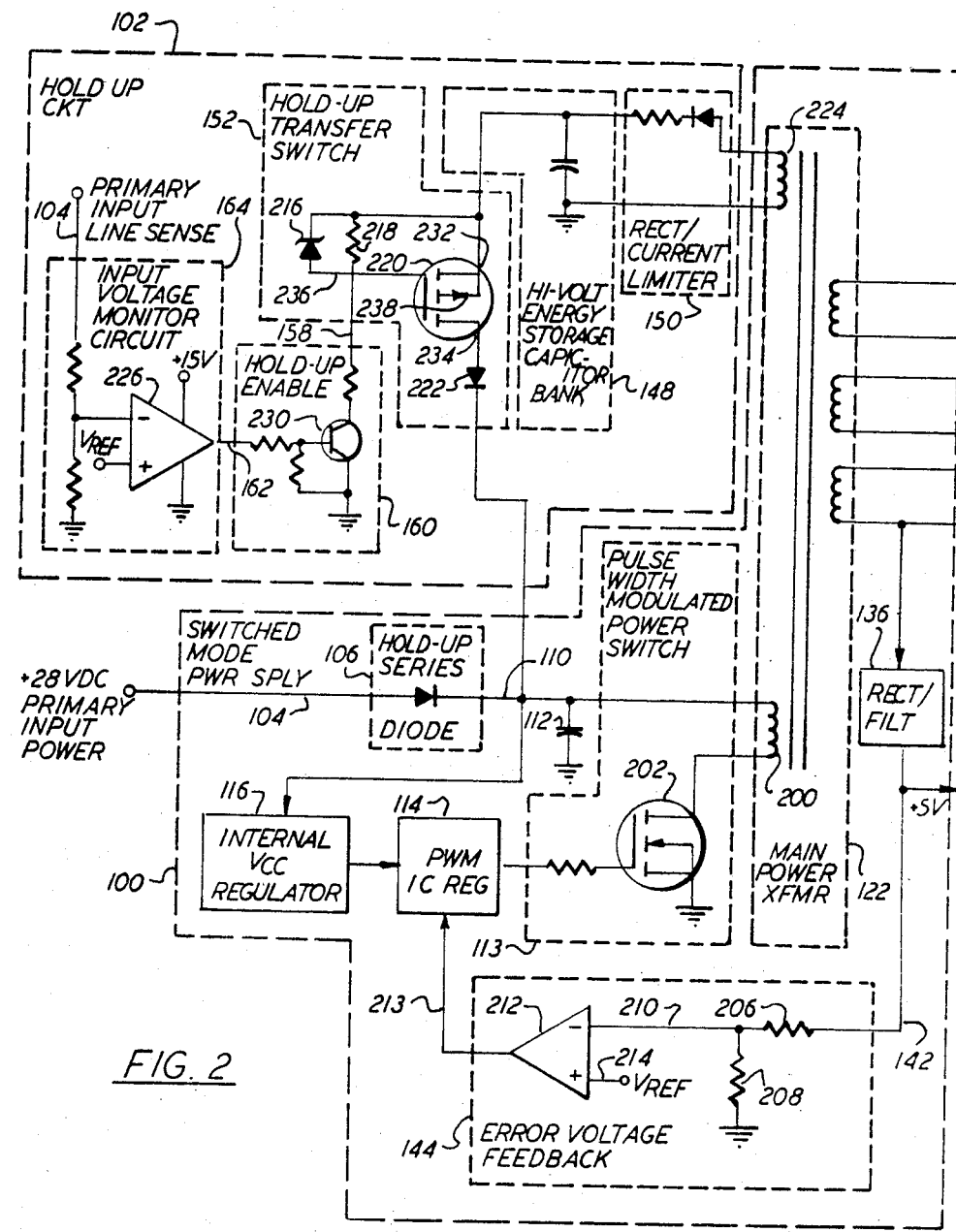
FIG. 2 is a simplified schematic block diagram of the switched mode power supply and holdup circuit of FIG. 1.

Referring now to FIG. 2, a simplified schematic block diagram of the typical switched mode power supply 100 and the holdup circuit 102 of FIG. 1 is shown. Primary input power (DC) on the line 104 passes through the series diode 106 onto the line 110 connected to the power supply input capacitor 112 and to a primary winding 200 of the transformer 122. The power supply input capacitor 112 is used to filter the input power and to store small amounts of energy during input power interruptions. A MOSFET power switch 202 is controlled by the pulse width modulator I.C. regulator 114. The hookup in this instance implies the use of a fly-back type regulator but it should be understood that a push-pull type could also be used. The PWM regulator receives output voltage sensing on the line 142 from the rectifier/filter 136 which is then divided by a voltage divider having resistors 206, 208. The divided voltage is sensed on a line 210 and then compared in a comparator 212 to a reference voltage on a line 214. The output of the comparator 212 on a line 213 controls the PWM I.C. regulator 114 which in turn causes the MOSFET switch 202 to alternate rapidly between conducting and nonconducting states thereby causing a pulsating current to flow through the primary winding 200 of the main power transformer 122. The magnitude of the feedback signal on the line 142 determines the pulse width. If the output voltage declines below a selected value the PWM I.C. regulator 114 will increase the pulse width in order to increase the output voltage. Once the output voltage is increased to the selected value the regulator will restore the pulse width to its normal value.

The holdup transfer switch 152 includes a zener diode 216, a resistor 218, a P-channel power MOSFET switch 220, and a diode 222. The holdup transfer switch 152 is used to transfer stored energy from the high voltage energy storage capacitor bank 148 to the low voltage bus on the line 110 upon receiving an enable signal on the line 158 from the holdup enable circuit 160. The holdup enable circuit 160 in turn receives a low input voltage signal on the line 162 from the input voltage monitor 164 which senses a decline in primary input line voltage below a selected value on the line 104. The energy storage capacitor bank 148 receives its energy from a secondary winding 224 of the transformer 122. The energy derived from the transformer 122 is rectified and limited in the rectifier/current limiter 150. As discussed above, during normal operation of the pulse width modulated power supply the primary input power on the line 104 is sensed by the input voltage monitor circuit 164. Upon sensing a decline in primary input voltage to a selected value a comparator 226 provides a low input voltage output signal on a line 162 to the holdup enable circuit 160 which is essentially a bipolar transistor switch 230. The enable circuit 160 is designed to provide a current path from the energy storage capacitor bank 148 through the zener diode 216 and the resistor 218 through the holdup enable switch 160 to ground. In accordance with the present invention, the transfer switch is uniquely designed using the P-channel MOSFET device 220 and the zener diode 216 connected from gate-to-source to limit the magnitude of the initial surge of current from the storage capacitor bank 148 to the low voltage input bus on the line 110 to the pulse width modulator. The clamping action of the zener diode 216 (operating in its avalanche region) limits the amount of current flow from the MOSFET source-to-drain. Since the zener consumes very little power this method of limiting the initial surge of current through the power MOSFET makes for a very attractive high-efficiency current-limited switch. The zener diode provides the ideal means of clamping the desired voltage across the gate node to source node without absorbing a significant amount of current. In this case the zener diode is not used merely to protect the thin $SiO_2$ dielectric between the gate node and the substrate 238 as has been done in some prior art applications, but is used to clamp the current flowing from the MOSFET source node to the MOSFET drain node. Thus, the avalanche voltage of the zener will normally be selected (contrary to the prior art) to some value within the maximum allowable operating current rating of the MOSFET device. Of course, the selected voltage will depend upon the particular application for which a particular clamped current value is desired.

Figure 3:
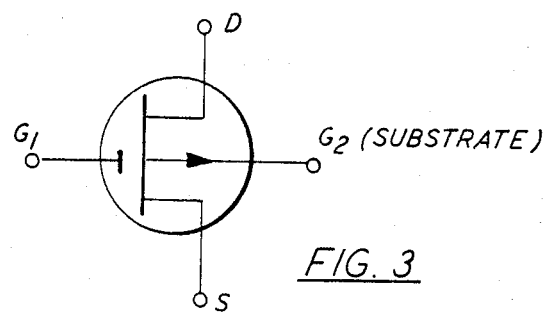
FIGS. 3, 4, and 5 are sketches illustrating various symbols used for a P-channel MOSFET.
Figure 4:
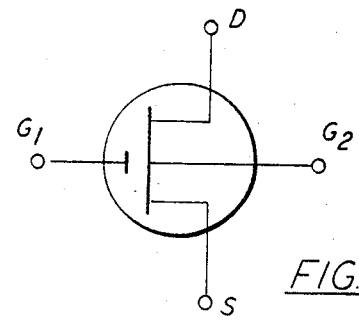
Figure 5:
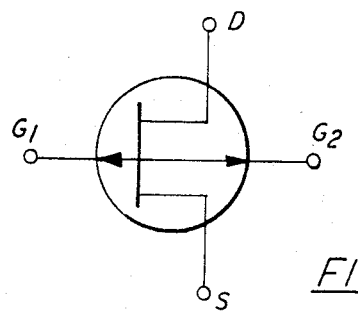

Although the invention has been described as being utilized in a holdup circuit as in FIGS. 1 and 2 it should be understood that the invention is not restricted to such a narrow use. The current-limited MOSFET switch of the present invention may be utilized in any circuit in which a method of limiting the, drain current through an FET is desired. It should also be understood that although the embodiment of FIG. 2 has depicted a P-channel MOSFET for use according to the present invention in the current-limited MOSFET switch, an N-channel MOSFET device, i.e., any insulated gate type FET may be used. Of course, it is well-known that among MOSFET devices there is a wide variety of symbology employed in the art. Even among P-channel MOSFETS there is a wide variety of symbology. For example, in FIGS. 3, 4, and 5 are represented various symbols for a P-channel MOSFET device. In other words, there is a wide variety of symbology employed to depict MOSFET devices and it is not intended, by using a particular one in the description of the invention to restrict it to usage with only one particular type. Therefore, the invention should be though of as typical of use in any generalized MOSFET.

In addition, it should be recognized that although the holdup circuit of FIGS. 1 and 2 has been described using a MOSFET clamped with a zener diode according to the present invention, the holdup transfer switch could have been designed using a bipolar transistor in lieu of a MOSFET clamped with a zener. In that case, a current limiting resistor in the output circuit of the transistor would be used. However, such an arrangement would not be particularly efficient because of the significant amount of the stored energy which would be consumed in the base circuit of such a transfer switch.

Although the invention has been shown and described with respect to a preferred embodiment thereof, it should be understood by those skilled in the art that the foregoing and various other changes, omissions, and additions may be made therein without departing from the spirit and scope of the invention.

We claim:
1. A current-limited switch, comprising:
   a metal-oxide-semiconductor field-effect transistor (MOSFET) having a maximum drain current rating and having its source and drain connected for conducting electrical current therebetween; and
   a zener diode connected between the gate and source of the MOSFET for biasing the gate of the MOSFET at the zener diode avalanche voltage for limiting the magnitude of the flow of electrical current between the MOSFET source and drain to an absolute value less than the absolute value of said maximum drain current rating.

2. A method for limiting the drain current in a metal-oxide-semiconductor field-effect transistor (MOSFET), comprising the steps of:
   selecting a zener diode having an avalanche voltage suitable for biasing said MOSFET at a level selected for limiting the absolute value of the MOSFET drain current to a value less than the absolute value of the MOSFET maximum drain current rating;
   connecting said zener diode between the gate and the source of said MOSFET; and
   applying a voltage to said MOSFET for biasing said MOSFET, at said avalanche voltage, for turning-on said MOSFET, and for providing a current-limited drain current between said MOSFET source and drain.

3. A current-limited switch, for limiting a current surge during a transfer of energy from a high voltage node to a low voltage node in the presence of the absolute value of the voltage of said low voltage node being less than the absolute value of a selected value, comprising:
   a metal-oxide-semiconductor field-effect transistor (MOSFET) having a source node, a drain node, and a gate node, and having a maximum drain current rating between said source node and said drain node, and having said source node and said drain node connected between said high voltage node and said low voltage node for conducting said current surge in the presence of said absolute value of the voltage of said low voltage node being less than said absolute value of said selected value;
   a zener diode, having an avalanche breakdown voltage, connected, for operation in its avalanche region, between said MOSFET gate node and said MOSFET source node for switching on said MOSFET and for limiting the magnitude of said current surge to a value having an absolute value less than the absolute value of said maximum drain current rating;
   holdup enable circuit means, for enabling a current to flow from said high voltage node through said zener diode in the presence of said absolute value of the voltage of said low voltage node being less than said selected value; and
   sensing circuit means, responsive to the present voltage of said low voltage node, for comparing the present value of the voltage of said low voltage node to said selected value and for providing an enable signal to said holdup enable circuit for enabling said holdup enable circuit in the presence of said absolute value of the voltage of said low voltage node being less than said selected value.

4. The current-limited switch of claim 3, further comprising a resistor connected between said MOSFET gate and said MOSFET source, in parallel with said zener diode, for permitting an electrical current to flow from said high voltage node through said resistor for keeping the MOSFET switched-on subsequent to a decline in the absolute value of the voltage of the high voltage node to a value insufficient to maintain the zener diode in said avalanche region.

* * * * *